United States Patent [19]
McFarland

[11] 4,383,184
[45] May 10, 1983

[54] POWER CONTROLLER

[75] Inventor: Harry G. McFarland, Lubbock, Tex.

[73] Assignee: Texas Instruments Incorporated, Dallas, Tex.

[21] Appl. No.: 163,238

[22] Filed: Jun. 26, 1980

[51] Int. Cl.³ .............................................. H02J 7/00
[52] U.S. Cl. ..................................................... 307/66
[58] Field of Search ........................ 307/64, 66, 85, 86

[56] References Cited

U.S. PATENT DOCUMENTS

| | | | |
|---|---|---|---|
| 4,065,676 | 12/1977 | Elias ....................................... | 307/66 |
| 4,104,538 | 8/1978 | Davies, Jr. ............................. | 307/64 |
| 4,204,249 | 5/1980 | Dye et al. .......................... | 307/64 X |

Primary Examiner—Michael L. Gellner
Attorney, Agent, or Firm—Melvin Sharp; Leo N. Heiting; Robert D. Marshall, Jr.

[57] ABSTRACT

A power controller system for continuously supplying power to an auxillary plug-in module includes a separate power source within the module and a sensing circuit for determining whether the main power supply is within a valid range. The main system includes a DC main power supply which is coupled to the plug-in module. The sensing circuit tests to determine whether the main power supply is connected to the plug-in module for a predetermined period of time before switching this main power supply to the power using portions of the module. In the event of loss of the main power supply, either by the removal of the module or by switching off the main power supply, the sensing circuit detects this loss and the power controller system switches to the separate power source within the module. In a preferred embodiment the main system also generates a clock signal for utilization by the plug-in module, the sensing circuit determining whether the main power supply has been connected for the predetermined length of time by reference to whether a predetermined number of clock pulses have been received.

12 Claims, 13 Drawing Figures

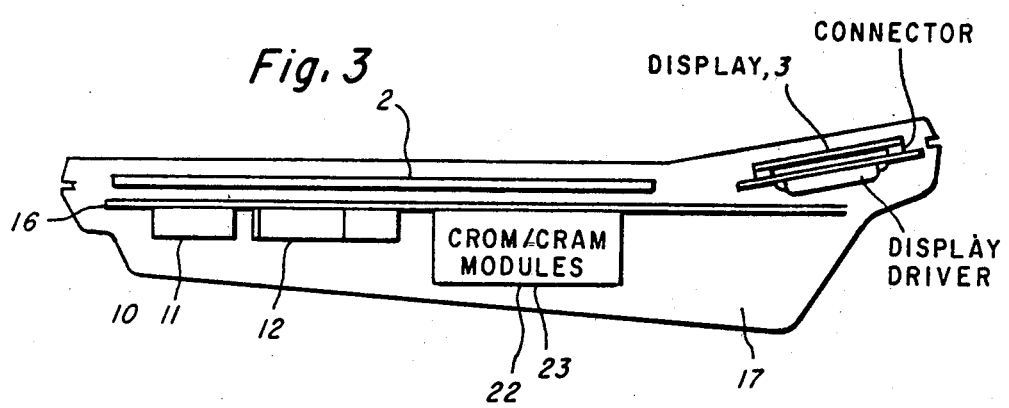

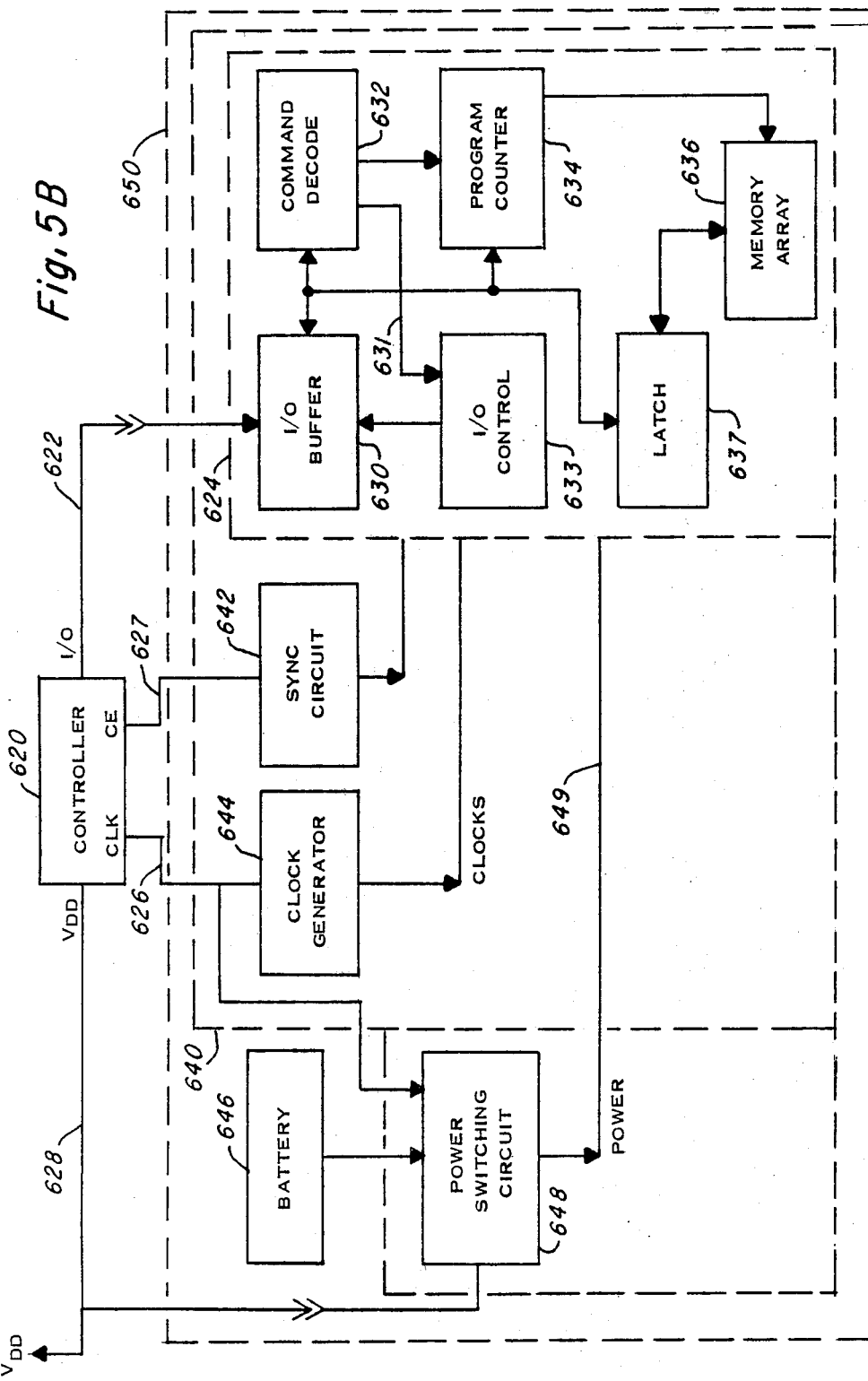

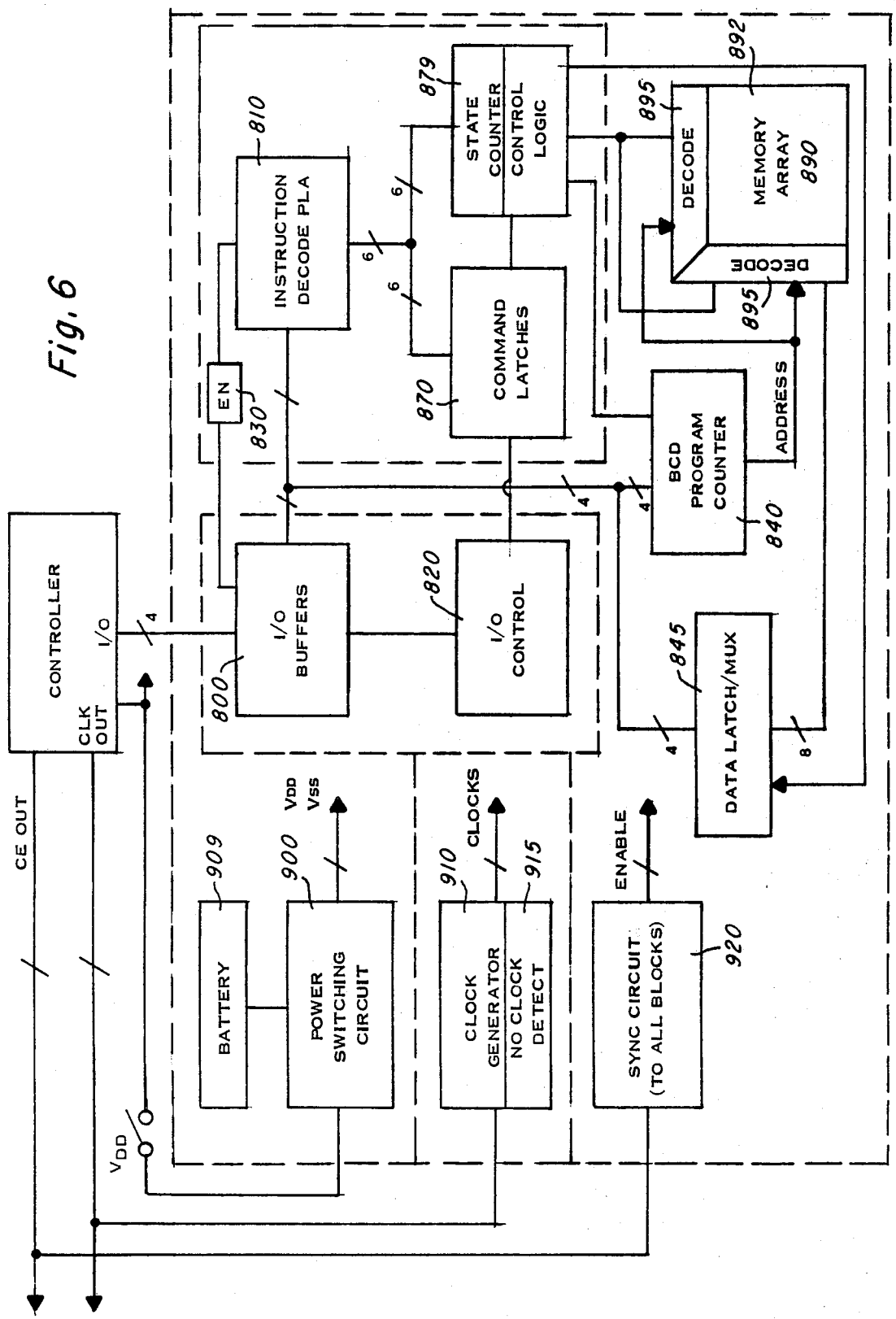

POWER CONTROLLER

BACKGROUND OF THE INVENTION

This invention relates to an integrated CMOS auxiliary power supply switching circuit and more particularly to the utilization of such a circuit a circuit along with a read/write memory so as to form a non-volatile read/write memory module.

In order to maintain the data stored in read/write memory, the auxiliary battery must supply power to an associated read/write memory chip. However, a problem arises in preventing the read/write memory from drawing power from the battery while the read/write memory is being powered from a main system power supply. Additionally, a second problem, which arises when such a non-volatile memory system is coupled to the main system power supply in addition to other integrated circuits being coupled to the main system power supply and interface buses, is in isolation the auxiliary battery from the additional integrated circuits coupled to the main power supply without necessitating additional external components for this purpose. The problem of providing a non-volatile read/write memory is further complicated where the read/write memory module containing the auxiliary battery power supply is removeable from the main system, that is, is a plug in memory module which upon being plugged into the main system couples to the main power supply plus an interface bus. One solution to this problem is to isolate the auxiliary battery power supply from the main system power supply when the module is coupled to the main system by using a blocking diode. When the main system power supply is not present at the non-volatile memory module power supply bus (either when the main power supply is shut off or when the module is not coupled to the main power supply bus), the blocking diode will be forward biased and supply power to the read/write memory circuit so as to maintain valid data therein. A problem with this solution is that when the main power is switched off, the auxiliary battery power supply is coupled to the main system power supply bus and the whole system is powered from the auxiliary battery power supply, not just the read/write memory module. Typically, the blocking diode forms an additional component within the module housing the read/write memory integrated circuit and the auxiliary battery power supply.

A partial solution to the problem of powering additional system circuits when the main system power supply is not present and the non-volatile memory is coupled to the main system supply bus is to separate the power bus line into individual power lines, coupling to each module independently. However, the problem with this solution is that it requires extra printed circuit board space to run the extra power line or lines, thereby raising the cost of the system.

It is therefore an object of the present invention to overcome the basic problems involved with the previous systems for protecting each non-volatile memory module and the auxiliary battery contained therein from powering other integrated circuits in the system. In addition, it is an object of the present invention to reduce to the component count by eliminating the need for an external blocking diode and extra switches needed with previous solutions to the non-volatile read/write memory problems.

SUMMARY OF THE INVENTION

A power controller includes an auxiliary power supply switching circuit. The auxiliary power supply switching circuit includes a first power circuit for providing a first power source and a second power circuit coupled to the first power circuit. The second power circuit includes a second power source independent of the first power source. The second power circuit further includes a circuit for continuously providing power from either the first power source or the second power source. In a preferred embodiment the first power circuit is comprised of a power supply external to the housing containing the second power circuit, and the second power source is comprised of an auxiliary battery contained within a housing common with the second power circuit. In the preferred embodiment the power controller is further comprised of a clock circuit coupled to the second power circuit, for providing a clock signal, wherein the second power circuit provides power from the first power source when said first power circuit is coupled to the second power circuit and a predetermined number of clock signals are received from the clock circuit, and wherein the second power circuit provides power from said second power source when the second power circuit is not coupled to the first power circuit or when the second power circuit is coupled to the first power circuit but the predetermined number of clock signals has not been received.

BRIEF DESCRIPTION OF THE DRAWINGS

The novel features believed characteristic of the invention are set forth in the appended claims. The invention itself, however, as well as a preferred mode of use, further objects, and advantages thereof, will be best understood by reference to the following detailed description of illustrative embodiments when read in conjunction with the accompanying drawings, wherein:

FIG. 3 is a side view of a calculator system of FIG. 1 and 2 detailing the relative placement of components within the calculator housing;

FIGS. 5A-C are block diagrams of systems having a memory means (either read-write, or read-only, or both types of memories);

FIG. 5B is a detailed block diagram of the system shown in FIG. 5A showing also the non-volatile memory embodiments of the memory means 624 of FIG. 5A, and FIG. 5C is a block diagram of a non-volatile memory module embodying the memory means 650 of FIG. 5B;

FIG. 6 is a block diagram of the read-write embodiment of the memory module 650 and the memory means 640 as shown in FIGS. 5B and 5C;

DETAILED DESCRIPTION OF THE INVENTION

Figure 1:
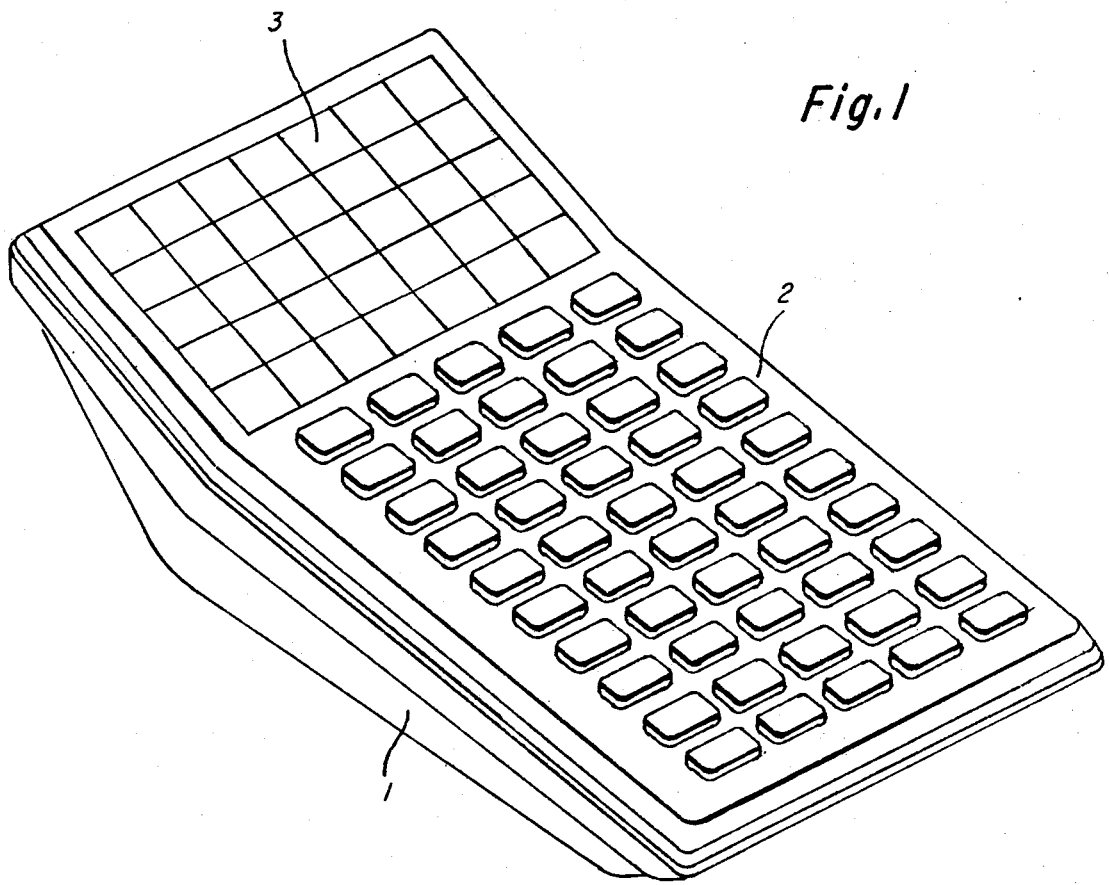
FIG. 1 is a pictoral view of a portable, electronic, handheld calculator of the type which embodies the present invention.

Referring to FIG. 1, an electronic portable calculator of the type which may employ features of this invention is shown in pictorial form. The calculator 1 comprises the keyboard 2, and the display 3. Display 3, in the preferred embodiment, consists of 16 alpha-numeric characters, each provided by liquid crystal display devices, or an array of light emitting diodes, a vacuum florescent tube display, or other display means. The display is preferably implemented having complete alpha-numeric display capability so as to be capable of displaying English language messages as well as permitting the display of data in scientific notation, or other output formats. Of course, the type of display and the number of digits displayed is a design choice. The display may be of the 7 segment, 8 segment, 9 segment, 13 segment, or $5 \times 7$ dot matric display character, depending on the character display flexibility desired. In a preferred embodiment, a $5 \times 7$ dot matrix per character position is utilized to allow for complete alpha-numeric and special character display. A keyboard, 2, or other input means, preferably includes a set of number keys (0-9), a decimal point key, a plurality of function command keys including, for example, exponential, logarithmic, trigonometric and hierarcy functions. The expotential and logarithmic function command keys include, for example, $X^2$, $\sqrt{X}$, $1/X$, $\log X$, $\ln X$, $y^x$, and $y\sqrt{X}$. The trigonometric functions include, for instance, the sine, cosine, tangent, and their inverses, the hyperbolic sine, hyperbolic cosine, and hyperbolic tangent, and inverse hyperbolic functions. Other function command keys include store (STO), and recall (RCL) keys for respectively storing and recalling a number stored in one of the memory registers. The enter exponent key (EE) allows exponent entry of the number displayed in scientific notation. A $+/-$ key is provided for changing the sign of the display number. An exchange key (X:Y) is provided for exchanging operator and operand of an arithmetic function. More conventional function command keys are supplied, including the clear key (C), the clear entry key (CE) and the plus $(+)$, minus $(-)$, multiply $(\times)$, divide $(\div)$, and equal $(=)$ keys. Other function keys, in a preferred embodiment, may include alpha-numeric variable keys (A-Z), parenthesis keys, hierarchy control keys, label key (LBL), and programmable feature function keys. The calculator is further provided with OP code keys for performing special functions such as slope, intercept, plotting operations, alpha-numeric operations, operating system hierarchy interface and control and the like.

Figure 2:
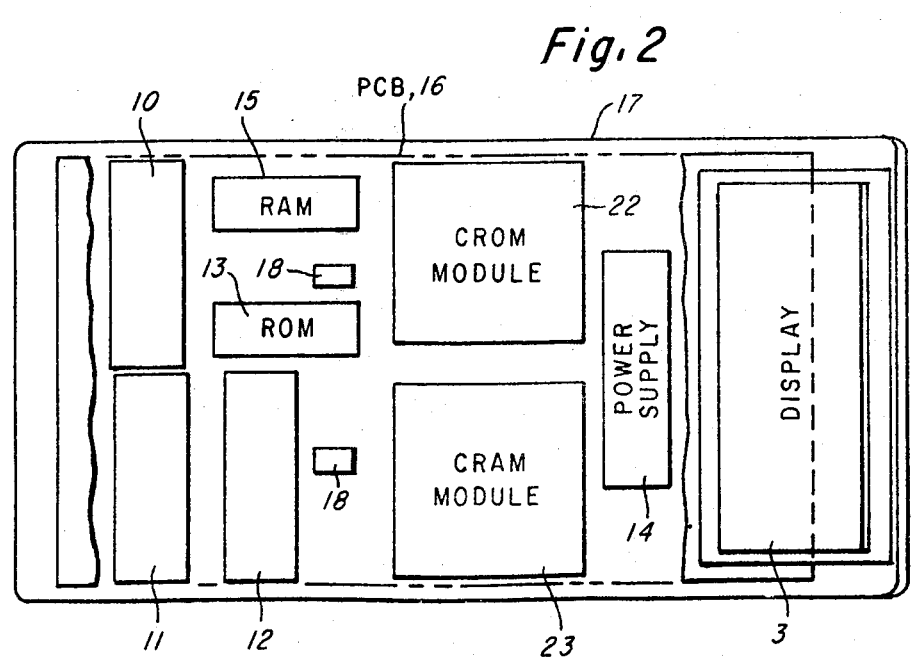
FIG. 2 is a bottom view of the calculator of FIG. 1 showing the placement of major components in the preferred embodiment of the invention of FIG. 1.

Referring to FIG. 2, a bottom view of the calculator 1 of FIG. 1 is shown. The placement of major components in a preferred embodiment of the calculator of FIG. 1 is shown. Controller integrated circuit chips 10, 11, and 12 provide the intelligence and control capabilities of the calculator system. Read/write memory 15, and read only memory 13, provide additional base system data storage beyond that provided on the controller chips 10, 11, and 12. A power supply 14 provides all necessary working voltages to the remainder of the calculator system's electronic components. The controller devices 10, 11 and 12, the read/write memory 15, the read only memory 13, and the power supply 14 are mounted to a main printed circuit board 16 within a calculator case 17. Additionally, compartments within the calculator case 17 are coupled to the main printed circuit board 16 to allow for interconnection of plug-in memory modules 22 and 23 for interconnection to the controller chips 10, 11 and 12.

Referring to FIG. 3, a side view of the calculator system of FIG. 1 and 2 is shown, detailing the relative placement of the controller chips 10, 11, and 12, the display 3, the keyboard 2, printed circuit board 16, and the memory modules 22 and 23, within the calculator case housing 17.

Figure 4A:
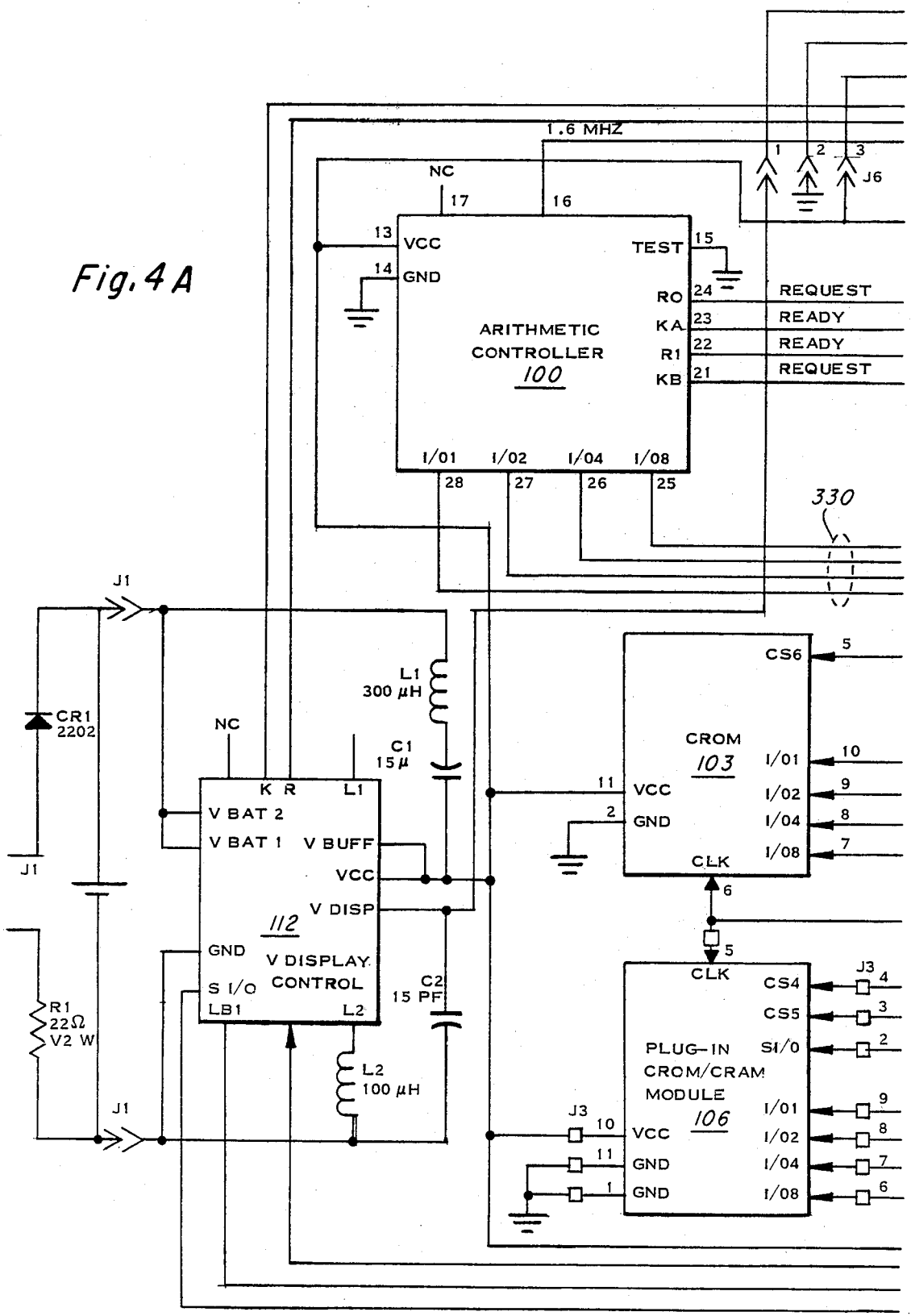
FIGS 4A-C form a detailed schematic logic diagram of a preferred embodiment of the calculator of FIG. 2.
Figure 4B:
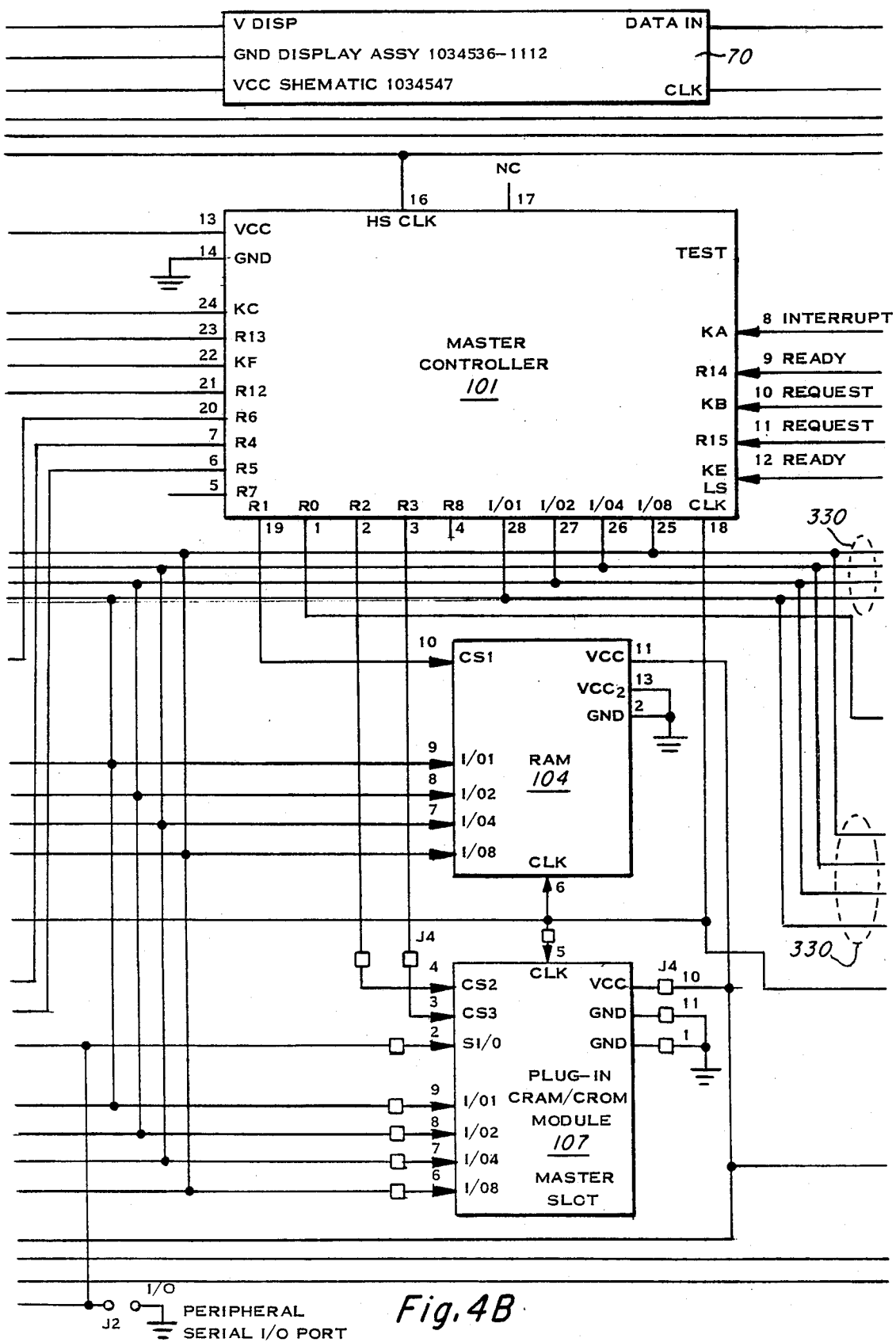
Figure 4C:
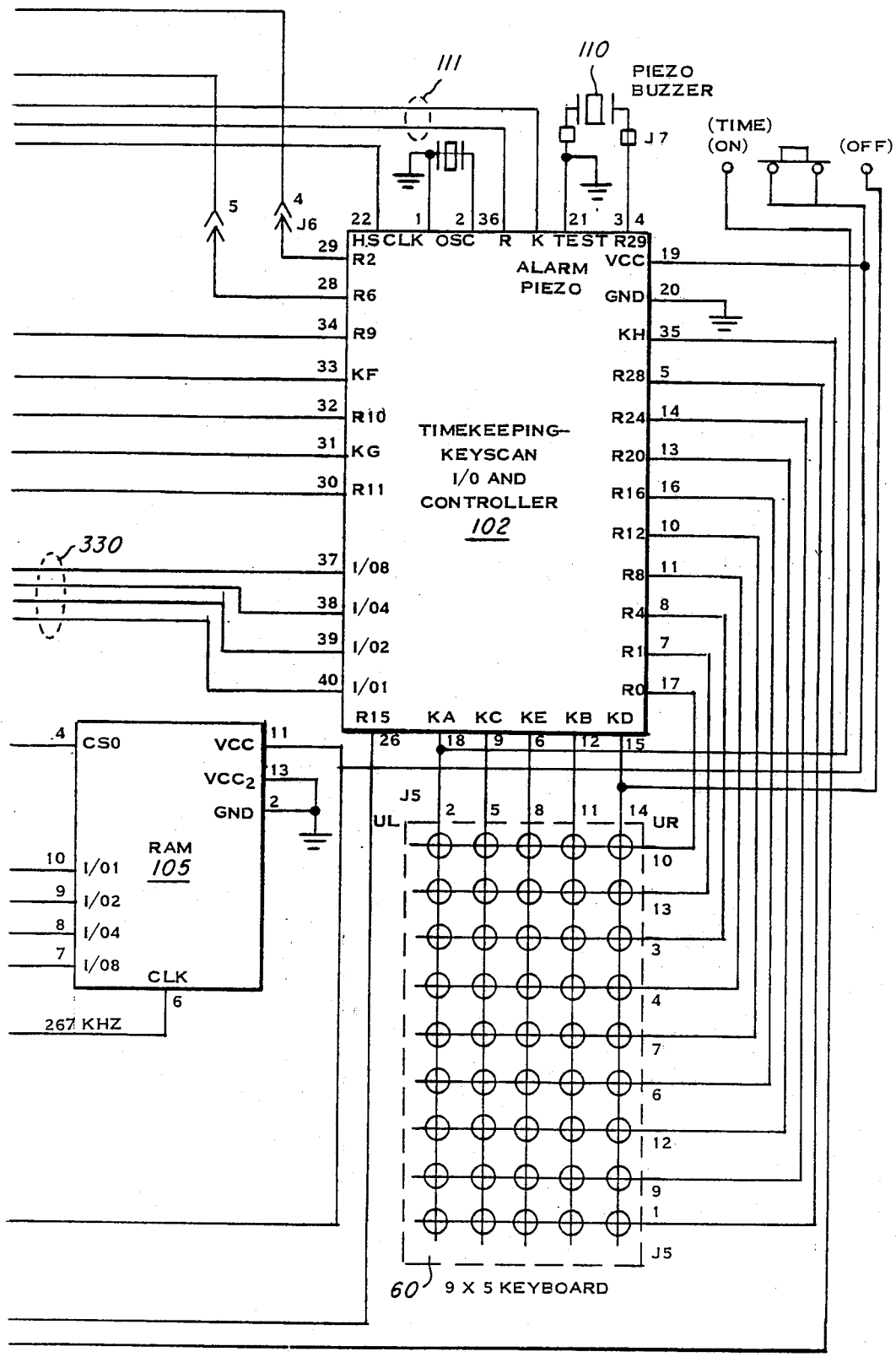

Referring to FIGS. 4A-C, a detailed schematic of an embodiment of the calculator system as implemented in the calculator 1 of FIG. 2 is shown.

The calculator system of FIGS. 4A-C may be comprised of a controller expandable in functional blocks, for providing arithmetic processing and data manipulation and processing such as the arithmetic controller 100, master controller 101 and timekeeping I/O controller 102; an input device, such as the keyboard 60, coupled to the controller, for providing outputs to the controller in response to an externally supplied stimulus; a memory such as the memory 103, 104, 105, 106, and 107, expandable in partioned blocks, coupled to the controller, for storing data and providing data outputs to the controller in response to receiving select inputs; display interface means, such as the cascadable display drivers 70 and display interface chip 112, expandable in partioned blocks, coupled to the controller, for receiving outputs from the controller representative of a desired character display, and providing display drive outputs corresponding to the desired character display compatable in voltage and timing with a selected display technology such as a liquid crystal display; and a display device such as a liquid crystal display, expandable in partioned blocks corresponding to the partioned blocks of the display interface means and connected thereto, the display device being of the particular display technology compatable with the display interface means and timing such as that output from that controller 112, for receiving the outputs from the display interface means and for providing a visable representation of the desired character display in response thereto. As is described in greater detail in copending application Ser. No. 168,853, filed July 14, 1980, the cascadable display driver 70 is comprised of a master display driver and at least one slave display driver, each display driver forming a partioned block of the display interface means. The master display driver is coupled to the controller and coupled to one of the slave display drivers, the master display driver converting a received output from the controller into a slave communication output for connection to the first slave display driver, all other slave display drivers being connected in a daisy chain with the first slave display driver. Each slave display driver couples the slave communication output from the proceeding slave display driver to the next slave display driver.

In the preferred embodiment, the calculator system of FIGS. 4A-C includes a controller expandable in functional blocks, for providing arithmetic processing and data manipulation and processing in the master controller 101, and timekeeping I/O functions in controller 102. In the preferred embodiment, the controller 100 of FIG. 4A. is combined to be contained with the controller 101. The master controller 101 is coupled to the I/O controller 102 to allow for communication between the individual controllers. The memory shown in FIGS. 4A-C is comprised of on-board read-only memory 103 and on-board read/write memories 104 and 105, as well as plug-in memories 106 and 107 which may be either read only, read/write or a combination thereof. The external stimulus means 60 is shown in part as a 9×5 keyboard coupled to the I/O controller 102 of the controller. Additionally, the I/O controller 102 is coupled to an external peripheral piezoelectric buzzer 110, and has provisions for connection to an additional external peripheral, such as printer connection 111. The display interface 40 is comprised of the cascadable display drivers 70 and the display interface voltage controller chip 112. The display voltage controller chip provides regulated multi-voltage power source supplies for the liquid crystal display, as well as for providing regulated power supply voltages to the integrated circuit chips of the calculator system of FIGS. 4A–C.

Figure 5A:
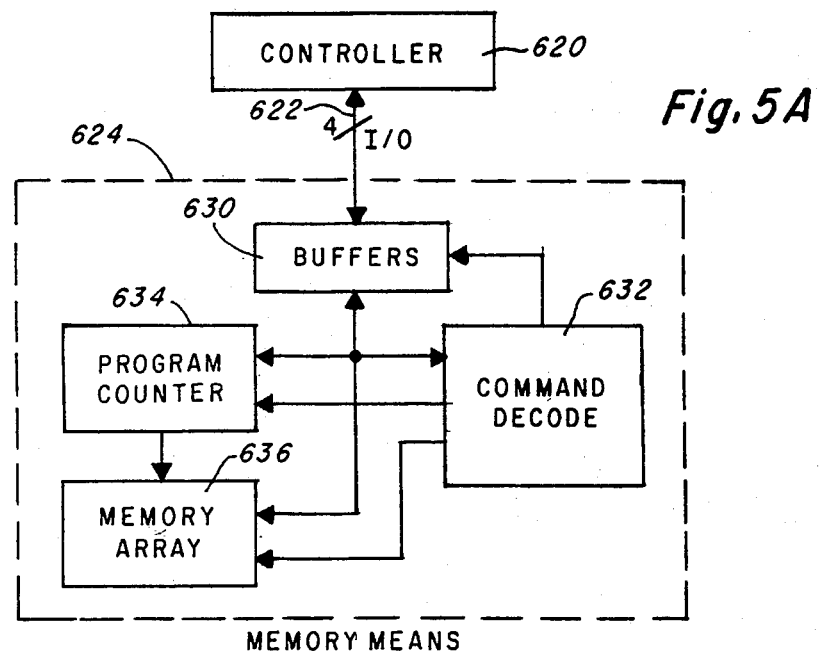

Referring to FIG. 5a, a block diagram of a memory system embodying the power controller of the present invention is shown. A controller 620 is coupled to a common I/O bus 622. The controller 620 provides command, data, and address signals onto the bus 622. A memory 624 is coupled to the I/O bus 622. The memory 624 is comprised of buffer amplifiers 630, command decode 632, program counter 634, and memory array 636. The signals received from the I/O bus 622 are buffered by the buffer amplifiers 630. The output from the buffer amplifiers 630 is coupled to the command decode 632, the program counter 634, and the memory means 636. The output from the buffer amplifiers 630 is selectively coupled to the command decode 632, program counter 634 or memory array 636, in response to an output signal from the command decode. The operation of the circuit of FIG. 5a may be better understood by tracing a complete cycle of the command protocol. Assuming first that the signals present on the I/O bus 622 are at the no-op state, the controller 620 outputs a command signal onto the bus 622 which is coupled to the memory 624, and specifically to the buffer amplifiers 630. The output from the buffer amplifiers 630 is coupled to the command decode 632 (instruction decode) which detects the command commencement transition and proceeds to decode the particular received command. Responsive to the received command from the controller 620, the command decode 632 provides an active decode output signal to the buffer amplifiers 630 to direct the output from the amplifiers to the program counter 634 or the memory array 636. Additionally, responsive to the received command signal, the command decode provides an active one of a second group of decode output signals to the program counter 634 and provides an active one of a third group of decode output signals to the memory array 637. The program counter 634 in response to the active decode output signal of the second group either stores received data from buffer amplifiers 630 within a counter memory, outputs the present program count value from counter memory to buffer amplifiers 630 to be coupled to the I/O bus 622, or outputs the program count value the to the memory array 636. The memory array 636 stores received data from the buffer amplifiers 630 at the location specified by the program counter output or outputs stored data from the location specified by the program counter output to the buffer amplifiers 630 for coupling to the I/O bus 622, responsive to the received active decode output signal of the third group from the command decode 632 and in response to the received output from the program counter 634. Upon completion of the command initiated (originated) cycle, the memory 624 outputs signals at the no-op state onto the bus 622 to prepare the system for a subsequent command cycle.

Figure 5C:
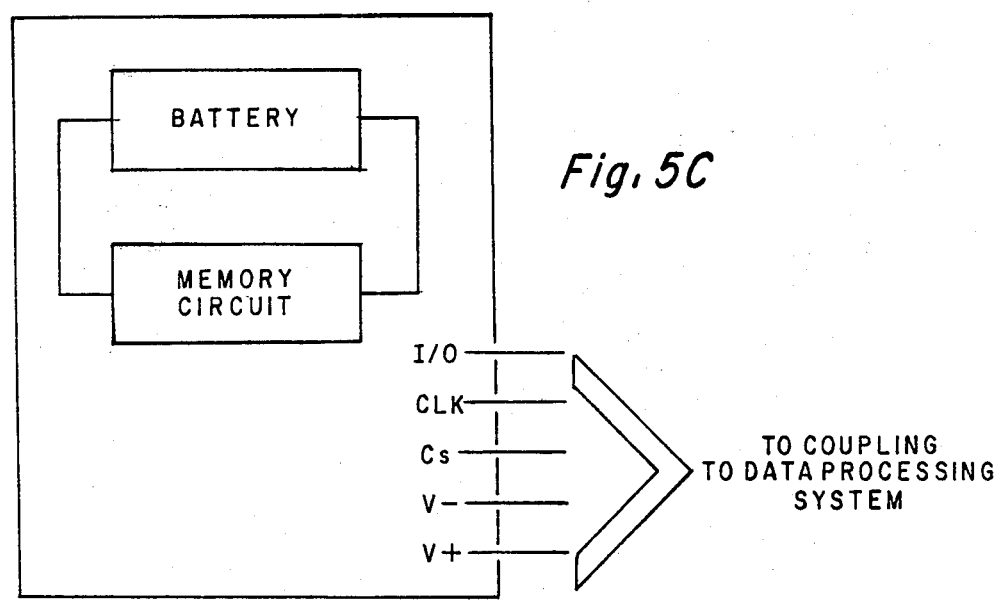
Figure 7:
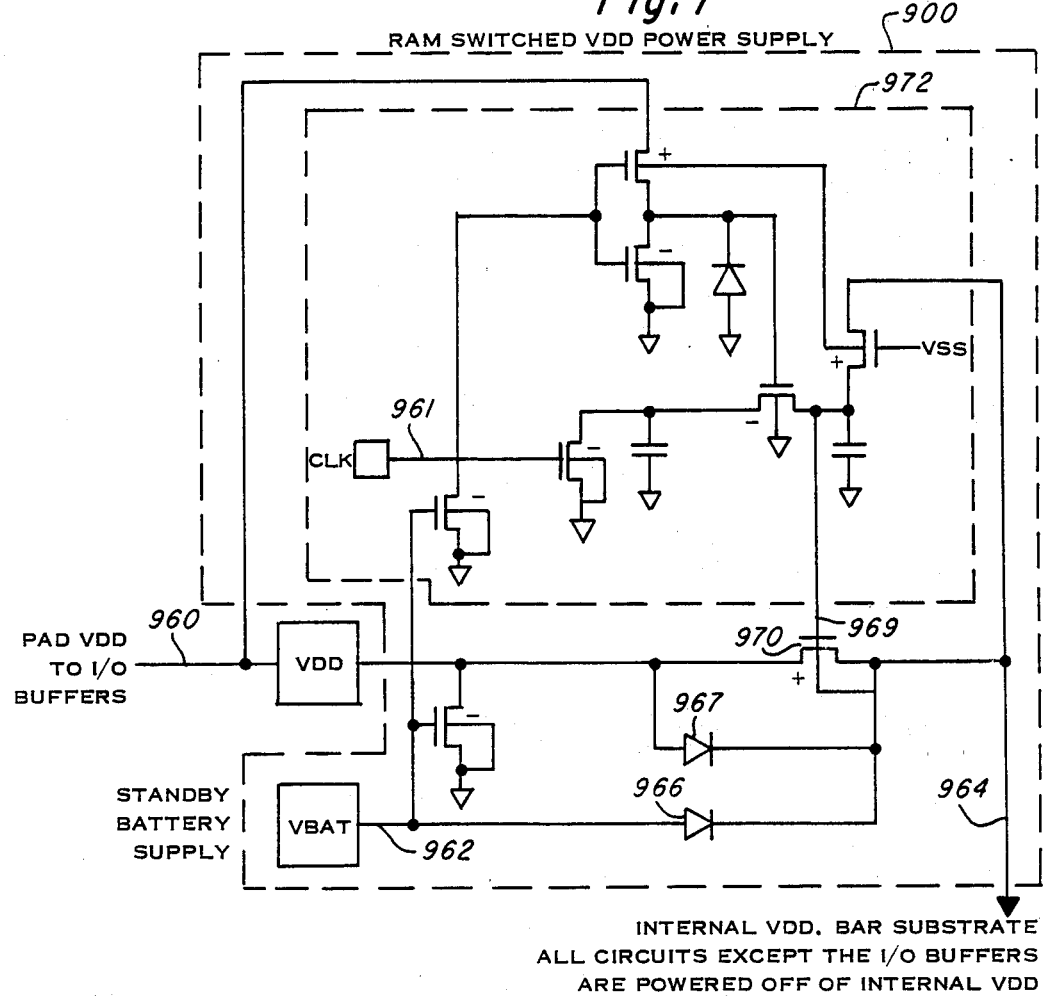
FIGS. 7 and 8 are detailed schematic diagrams of the power switching circuit 900 of the memory means 640 of FIG. 5B and FIG. 6.
Figure 8:
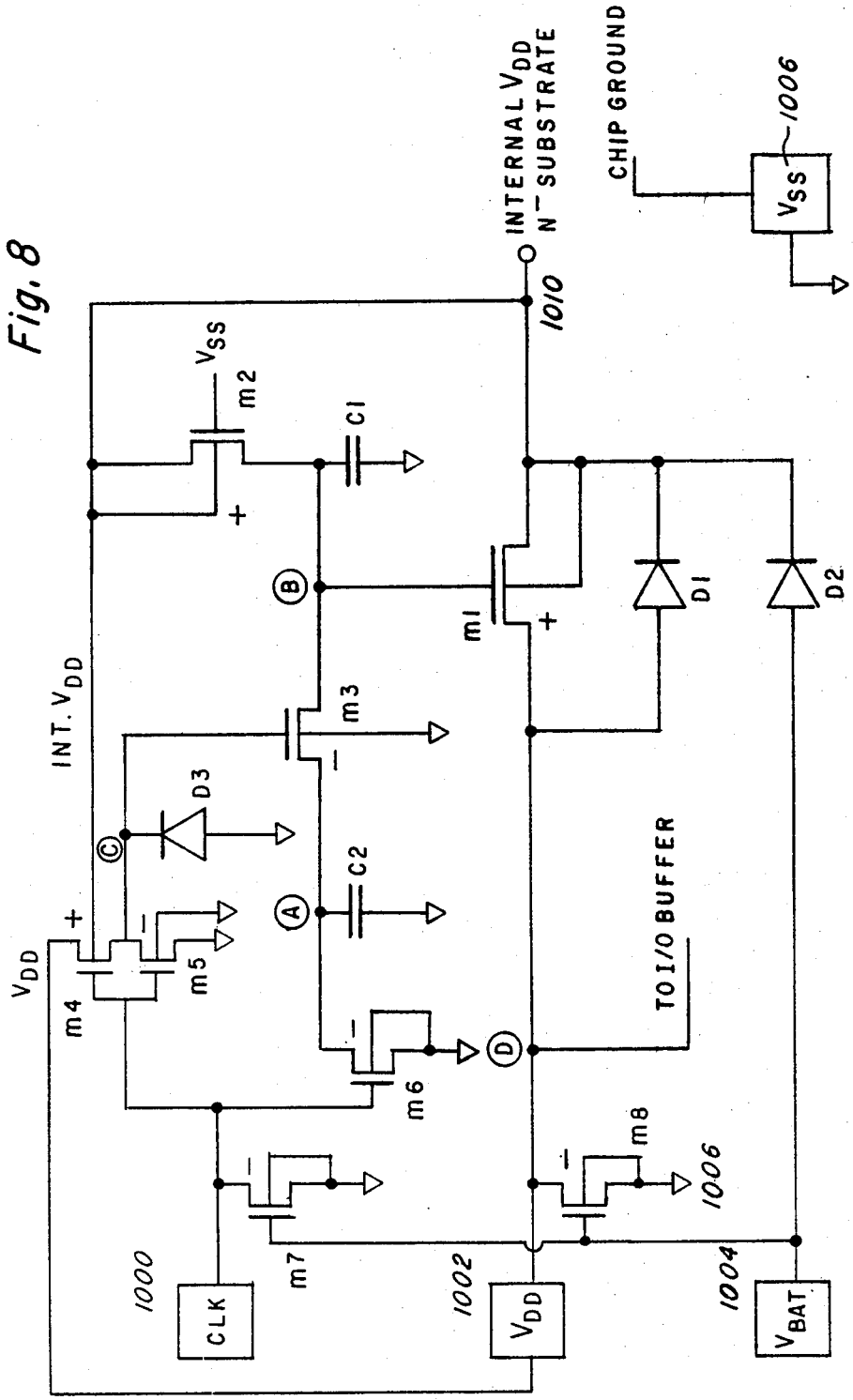
Figure 9:
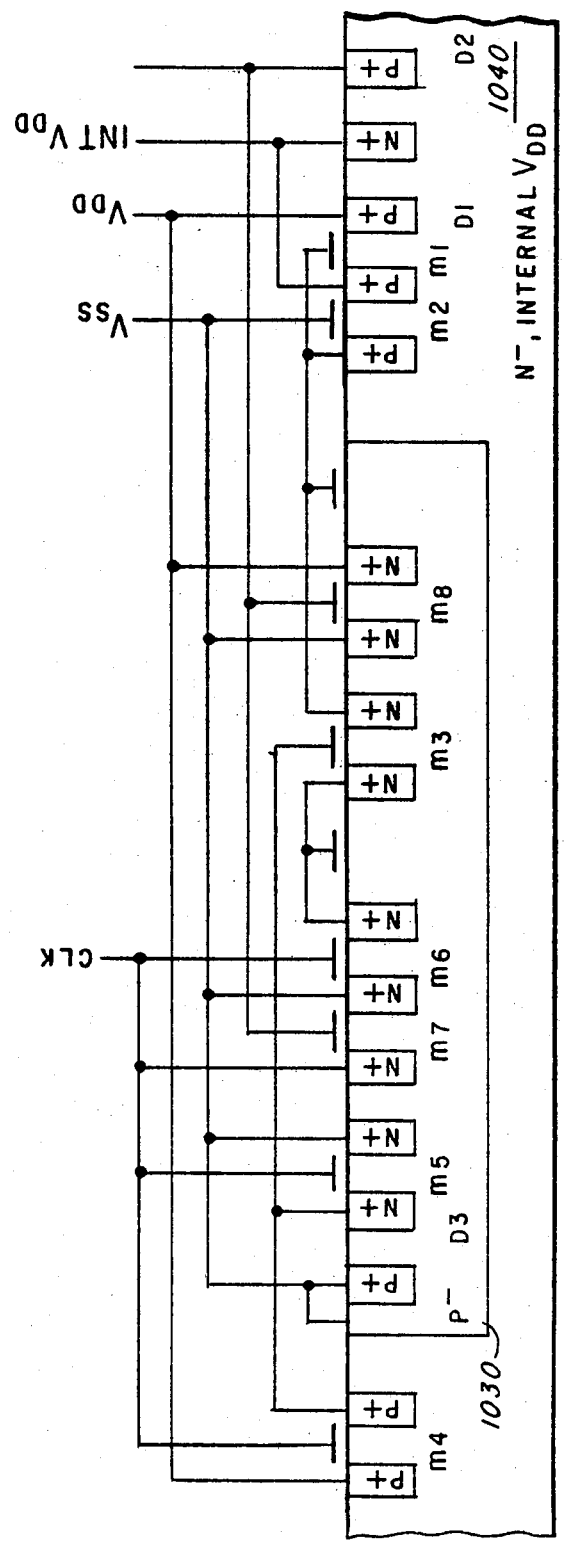
FIG. 9 is a cross-section of the circuit of FIGS. 7 and 8, shown in the preferred CMOS embodiment.

Referring to FIG. 5b, a more detailed block diagram of FIG. 5a is shown. The memory 624 is shown as further comprising an I/O control 633 coupled to the buffer amplifier 630 and command decode 632. The I/O control 633 selectively couples one of a data bus, an address bus, and a control bus within the memory 624 to the common I/O bus 622 via the buffer amplifiers 630 responsive to a fourth command signal 631 received from the command decode 632. The command decode 632 provides the fourth control output 631 in response to receiving selected ones of the command signals. Additionally, the memory 624 is shown as being further comprised of a latch 637 coupled to the buffer amplifiers 630, the command decode 632, and the memory array 636. The latch 637 provides data word size and format conversion to allow an 8 bit wide memory array 636 to couple to a 4 bit wide I/O bus 622 in the preferred embodiment. This concept may be expanded to other word size conversions. Alternatively, the memory array 636 may be comprised of an array organized of the same word width as that of the I/O bus 622 thereby obviating the need for a word size format conversion and for the latch 637. In a preferred embodiment, an integrated circuit 640 includes the memory 624 coupled to a synchronization circuit 642, to a clock generator circuit 644. When the memory array 636 is a read/write memory array, the integrated circuit 640 further includes a power switching circuit 648. In the read/write memory preferred embodiment, the power switching circuit 648 provides a power output 649 coupled to the memory 624. In the preferred embodiment, the integrated circuit 640 is mounted within a housing 650, which is a portable housing provided for coupling and mounting into a module receipt compartment within the housing that contains the controller 620. The module 650 provides for coupling of a synchronizing oscillator clock signal 626 to the clock generator 644. The clock generator 644 provides clock outputs to the memory 624 responsive to the received clock signal 626 from the controller 620. Additionally the module 650 has provision for coupling to a chip enable or chip select output 627 from the controller 620 to the sync circuit 642 of the integrated circuit 640 of the module 650. Responsive to the chip enable signal 627, the sync circuit 642 selectively provides an enable output to the memory 624 so as to activate command decode 632 and related circuitry within the memory 624 so as to be responsive to the signals on the I/O bus 622. Furthermore, the module 650 has provision for coupling the main power source of the controller 620, which may be a battery contained within the common housing of controller 620, or may be an externally provided power source. However in a read/write memory (RAM) embodiment of the memory array 636 and therefore, in a read/write memory plug-in module 650, the main power source 628 is coupled to the integrated circuit 640 only via power switching circuit 648. Additionally, in the read/write memory embodiment of the module 650, an independent power source, battery 646, is contained within the module 650 and coupled to the power switching circuit 648 of the integrated circuit 640 as shown in FIG. 5C. The output from the power switching circuit 648 provides a constant power output 649 to the memory 624, either from the main power source 628 of the controller 620 or from the battery 646 of the module 650. The power switching circuit 648 provides uninterrupted power output before, during, and after coupling to the main power source 628.

The power switching circuit 648 is coupled to the clock output 626 via the clock coupling of the module 650. The power switching circuit 648 provides the power output 649 from the main power source 628 when the main power source 628 is coupled to the power switching circuit 648 and a predetermined number of clock signals are received from the clock output 626, detected and counted by the power switching circuit 648 and a predefined count is reached, or alternatively after a fixed time interval has expired during which the clock outputs are properly (continuously) received. Alternatively, when the power switching circuit 648 is not coupled to the first power source 628, or when the power switching circuit 648 is coupled to the first power source 628 but the predefined number of clock signals (for the predetermined time) has not been received via the clock output 626, then the power switching circuit 648 provides said power output 649 from the module battery 646. Thus, the RAM module 650 includes the power switching circuit means 648, within the integrated circuit 640, to provide a non-interrupted power source, 649, to the read/write memory cells in the memory array 636, from either the battery 646, or the external power source 628, independent of the status of coupling to the external power source 628. This results in a non-volatile, removable, read-write memory allowing for both in calculator program development and simultaneously providing a removable transportable non-volatile program storage file.

Referring to FIG. 6, a block diagram of the read-write embodiment of the memory module 650 and the memory 640 as shown in FIG. 5b is shown in further detail. The basic functional circuit blocks of FIG. 6 includes the power switching circuit 900, which in the preferred embodiment forms an integral part of integrated circuit 630, and a battery 909 which forms an integral part of the memory module 650 and provides for coupling to the integrated circuit power switching circuit 900.

Referring to FIG. 41, the power switching circuit 900 of the memory means 640 is shown in detailed schematic form. In the preferred embodiment, input node 960 provides a coupling for connection of the external system VDD power source to the switched VDD power supply circuit 900 of the RAM module. Input node 962 provides for coupling to an external power source, such as a standby (or auxiliary) battery supply, which provides a power source at a sufficient voltage level to maintain valid data in the memory array 890. The power switching circuit 900 provides an output 964 which is coupled to the internal power bus of the read/write memory, coupling to all circuits except the I/O buffers 800. Finally, an input node 961 is coupled to receive the externally supplied clock input signal which is also coupled to the clock generator 910. The output 964 provides a constant power source to the internal power bus of the read/write memory, continuously providing power from either the external system supply via input 960 or the standby battery supply via input 962. The power switching circuit 900 provides power at the output 964 from the system power source as received at node 960 when a proper voltage level is received at the input node 960 and after a predetermined number of clock signals have been received at the clock input node 961. When an inadequate voltage level is received at the system power source input 960, or when an adequate power signal level is received at the input node 960 but the predetermined number of clock signals has not been received at clock input node 961, then the power switching circuit 900 provides power from the standby battery supply via input node 962 to node 964. Diode 966 of the power switching circuit 900 provides isolation of the standby battery supply from the system power supply when the system power supply is coupled to the output node 964. When a proper power source input is received at node 960, and a predetermined number of clock pulses have been received at node 961, enable output 969 switches transistor 970 to a conductive state, thereby coupling the system power supply as received at node 960 to the output node 964 for coupling to the internal power bus of the read/write memory. When this occurs, diode 966 performs a blocking function, being reversed biased since the system power supply coupled to input node 960 is at a sufficiently greater positive voltage level than the standby battery supply coupled to the input node 962. This is so because the standby battery supply coupled to the input node 962 needs only to supply a voltage level sufficient to sustain the memory array 890 within the read/write memory. However, the system power supply as coupled to input node 960 must additionally power the logic circuitry within the read/write memory, and must therefore be at a greater positive voltage level than that required for the standby battery supply. Diode 967 shunts transistor 970, coupling the power source as received at node 960 less the voltage drop across the diode 967 to the output node 964, this coupling of the voltage to output node 964 occurring prior to and concurrently with the coupling of the input voltage to output node 964 by transistor 970. Diode 967 prevents input voltages less than the voltage level of the standby battery supply from being coupled to the output node 964, but allows voltages greater than the standby battery supply to be coupled to the output node 964 pending enablement of transistor 970 by the clock detection circuitry 972.

In a preferred embodiment, the power supply switching circuit 900 is designed in metal gate CMOS technology. Additionally, in the preferred embodiment, the process utilized has P channel transistors built on an N-substrate and has N channel transistors built in a P- tank, the N- substrate of the chip coupled to the +V or internal VDD power supply. To solve the problems associated with providing a non-volatile read/write memory in a removeable module, the following features are provided by the present power supply circuit 900. First, the blocking diode (966 of FIG. 41, D2 of FIG. 42) for the auxiliary battery supply is built into the integrated circuit, thereby eliminating one external component from the system. Secondly, a timing feature is incorporated in the power switching circuit 900 to allow the switching circuit to disregard noise on the input lines to the integrated circuit when the module is unplugged from a powered system, or when the module is plugged into a system but power is not provided by the main power supply. This feature protects the memory array and auxiliary battery supply both. Thirdly, a pull down resistor (M8 of FIG. 42) is coupled to the input coupling to the main power supply bus (VDD) line. When the main power supply is turned off, the main power supply bus line will float, unless otherwise controlled. The internal resistive element transistor M8 is coupled so that the main bus power supply input is pulled to ground (VSS in the preferred embodiment) when the main power supply is switched off. This feature eliminates the need for providing external resistors in the module or in the system which would otherwise be required to perform this function of logic level (state) pull down. Additionally, there is an internal resistor (M6 of FIG. 42) pull down coupled to the clock input (1000 of FIG. 42) so as to insure that the clock input is coupled to ground when the system is powered down or the module is unplugged from the controller housing. This assures that the read/write memory in the nonvolatile memory module is maintained in a deselected state so that no false data may be written into or read from the circuit. This feature eliminates the need for an external pull down resistor within the module or within the main system which would otherwise be required to fulfill this function. Furthermore, the internal resistors coupled to the main power supply bus line (VDD) input and the external clock input may be disabled by coupling the auxiliary battery power supply input to ground. In the preferred embodiment, the pull down transistors are comprised of MOS resistors M7 and M8 of FIG. 42, the gates of transistors M7 and M8 coupled to the auxiliary battery input 1004 VBAT. This feature allows the read/write memory circuit within the nonvolatile memory module to be powered directly from the main power supply VDD in a standby low power mode with slightly lower current drain than is required by the non-volatile memory in its normal standby mode with an auxiliary battery coupled to node 1004. Additionally, the switching circuit 900 provides means for coupling the main power supply (VDD) to the internal buffers within the integrated circuit, bypassing the switched supply transistor M1. This feature allows for an increased current capacity for the buffers in the memory integrated circuit, and reduces the current spikes in the internal circuits of the memory integrated circuit when the buffer circuits of the memory integrated circuit switch states. This feature is shown in FIG. 42 as node D which is coupled to the buffer amplifiers 800 in the memory integrated circuit. Finally, no power is drawn from the auxiliary battery power supply as long as the main power supply VDD is at a voltage level greater than that of the auxiliary battery power supply.

In the preferred embodiment, the switching circuit is designed to operate in one of five modes of power supply operation. These modes are responsive to the detection of the presence or absence of the clock input signal 1000 coupled to the clock input node and to the voltage levels present on the external power supply (VDD) node 1002 and auxiliary battery standby power supply (VBAT) node 1004. In the preferred embodiment, the internal clocks on the read/write memory circuit are only activated when an externally supplied chip enable signal coupled to the memory means 640 is at a high logic level (1). When the chip enable signal is at a low logic level (0), the internal clock phases are set to predetermined states and all circuit nodes are forced to a static logic state, as disclosed in greater detail in U.S. Pat. No. 4,317,180, issued Feb. 23, 1982 to Kenneth A. Lies for "Clocked Logic Low Power Standby Mode", assigned to the assignee of the present invention. When the clock input signal at node 1000 is at a non-cycling (stopped) state, the clock input node 1000 is forced to a default low logic level state as a result of a node pull down transistor M7. The five modes of operation for the power supply switching circuit in the preferred embodiment are comprised of: (1) normal operation with the switching circuit receiving active clocks and with the voltage level of VDD greater than the voltage level of VBAT; (2) standby mode with the system powered from the external VDD supply, that is, with VDD greater than VBAT, but with no active clock input signal at node 1000; (3) power down mode where the system is not powered from the external power supply, that is, VDD is floating, with the clock inputs 1000 being at an inactive level and therefore no clock is cycling, and with VBAT greater than VDD, such that VBAT provides total power to the memory circuit; (4) normal operation mode two, where the circuit receives clock signals at node 1000 in an active state, where VDD is at the system power voltage level, and where no battery power supply is provided at node 1004, that is, VBAT=VSS; and (5) standby mode two where there are no active clock inputs to the system (the clock signal at 1000 is non-cycling), where there is no auxiliary battery supply provided, that is, VBAT=VSS, and where the external power supply VDD provides total power to the memory circuit.

In the normal operation mode the switching circuit receives an active clock signal at 1000 and the VDD power supply and VBAT auxiliary supply are present, with VDD being greater than VBAT so as to effectively switch VBAT off from supplying power to the system. When the non-volatile read/write memory is coupled in a system (that is, the module is plugged in), and this mode is entered, command instructions are accepted and executed by the memory 640. In the preferred embodiment, at least 20 clock input signal cycles must be cycled through before a command is accepted as issued to the memory 640.

Referring to FIG. 42, as the input clock signal at node 1000 is switched high, transistor M6 is enabled so as to couple node A to ground. Node C is at a low logic level, turning off transistor M3. When the clock signal at node 1000 is switched low, node C is caused to switch to a high logic level, thereby turning on transistor M3 and allowing capacitors C1 and C2 to charge together. In the preferred embodiment, capacitor C2 is approximately ⅓ the size of capacitor C1 to aid in maintaining a stable low logic level on node B, even when the clock input signal at node 1000 is cycling at a low frequency, 100 KHz in the preferred embodiment. As the clock input at node 1000 is switched to a high voltage (logic) level, transistor M3 is turned off and transistor M2 is enabled so as to switch to couple node B to a high logic level. Transistor M2 and capacitor C1 are sized to provide a long RC time constant to provide an initial time out period. After approximately 20 clock input signals at node 1000 have been received, node B will have discharged very close to ground, and transistor M1 will thereby be turned on (enabled) and driven hard. Transistor M1 thereby couples a full VDD voltage level from the VDD input 1002 to which transistor M1 is coupled to the memory circuit internal VDD node 1010. If the voltage level of the VDD signal at node 1002 is greater than the voltage level of the VBAT auxiliary power supply signal at node 1004, and the internal VDD node 1010 is approximately equal to the external VDD supply at node 1002, then diode D2 will be reversed biased and no power is drawn from the auxiliary battery power supply VBAT from node 1004. In the preferred embodiment, the clock input signal 1000 and the VDD input signal at node 1002 are coupled via 30 Megaohm resistors (M7 and M8, respectively) to ground (VSS). Other resistor values may also be used. These provide pull down of the input nodes 1000 and 1002 to a low logic level when the input signals coupled to node 1000 and 1002 are at a floating (non-fixed) voltage level. This prevents spurious signals from propogating through the power switching circuit to the memory circuit in the non-volatile memory system. In the preferred embodiment, transistors M7 and M8 provide the pull down functions for nodes 1000 and 1002, respectively.

In mode number 2, the standby mode of operation, the external power supply is active and coupled to the VDD input node 1002, with the input voltage level at a VDD input node 1002 being greater than the voltage level present at VBAT input node 1004, and the clock input signal coupled to clock input node 1000 is at an inactive non-cycling level. In between instruction execution cycles, the data processing system switches into a standby state and the non-volatile memory system as well as other circuits coupled into the data processing system, are powered from the main power supply VDD. However, since there are no system clocks cycling in this mode, that is the clock signals are inactive and steady state, each circuit coupled into the data processing system is forced into a static standby mode state, including the non-volatile memory module having the power switching circuit therein. In making the transition from normal operation to standby mode operation, the clock input signal 1000 ceases to cycle and settles at a low logic level. Transistor M6 is turned off, and transistor M3 is turned on. Transistor M2 slowly pulls node B up to an internal VDD level (as present at node 1010) turning off transistor M1 and causing the internal VDD node 1010 to discharge towards ground (VSS). When the internal VDD node 1010 reaches a voltage level one diode drop below (less than) the voltage level present at VDD input node 1002, the diode D1 becomes forward biased and couples power to the internal VDD node 1010. As long as the external power supply provides a voltage level at the VDD input node 1002 such that VDD (the voltage present at node 1002) is greater than VBAT (the voltage present at node 1004), then the diode D2 is held in a reversed biased condition, and no power is drawn from the VBAT supply via VBAT input node 1004.

In the third mode, the power down mode, the external power supply is inactive and couples an indefinite (floating) voltage level signal coupled to input node 1002. Furthermore, a system clock coupled to input node 1000 is at an inactive non-cycling mode so that no input clocks are presented to the power switching circuit. In this mode the auxiliary battery power supply coupled to the VBAT input node 1004 provides total power to the system. This mode is of particular importance when the non-volatile read-write memory module is used as a plug in memory module for coupling to a data processing system, such as in a calculator. In this embodiment, there is packaged with the non-volatile memory integrated circuit (including the power switching circuit in the preferred embodiment) an auxiliary battery power supply coupled to the VBAT input node 1004. When the data processing system is switched off, the external power supply VDD coupled to the input node 1002 is disconnected, and the voltage level of the signal coupled to the VDD input 1002 is floating, however the voltage level present at the VDD input node 1002 is pulled to ground by pull down resistive load transistor M8. The non-volatile memory system, and more particularly the power switching circuit, automatically switches to the stand-by power down mode. When the externally supplied system power coupled to node 1002 is turned off, transistor M8 acts as a resistive pull down to pull the input node 1002 to the ground level (VSS). The internal VDD voltage level at node 1010 will drop (decrease in magnitude) in concert with the voltage level at the external VDD input 1002 because transistor M1 remains temporarily enabled upon initial switching to the power down mode. The voltage at input node 1002 and at interval VDD input node 1010 decrease until diode D2 is turned on (forward biased) so as to couple the auxiliary battery power supply via input node 1004 to the internal VDD input node 1010 so as to provide power to the memory array in the non-volatile memory system. As long as transistor M1 remains turned on, transistor M8 is unable to pull the system VDD input node 1002 to the ground level (VSS). However, after a period of time, transistor M2 charges capacitor C1 to the internal VDD input voltage level at node 1010, thereby turning off transistor M1, thereby allowing transistor M8 to pull the external system VDD input node 1002 to the ground voltage level (VSS). Diode D3 provides a leakage path so as to discharge the remaining charge trapped on node C when transistor M4 is turned off upon loss of a positive voltage level at the VDD input node 1002 as coupled to transistor M4. With transistors M1 and M3 turned off, the internal VDD voltage level at node 1010 is isolated from the VDD input node 1002 (from the external system), with the auxiliary battery power supply VBAT supplying necessary current (leakage) to the remainder of the memory circuit through diode D2. If the non-volatile memory module is now unplugged from the data processing system, transistor M7 and M8 maintain input nodes 1000 and 1002, respectively, at a ground level, thereby isolating the auxiliary battery power supply coupled to node 1004 and the internal VDD supply present at node 1010 from the outside environment, preventing spurious clock input and VDD inputs at nodes 1000 and 1002, respectively.

In the fourth mode of operation, normal operation mode two, and in the fifth mode of operation, standby mode two, there is no auxiliary battery power supply coupled to VBAT input node 1004, the VBAT input node 1004 being coupled to the integrated circuit ground node VSS 1006. The voltage level at the VBAT input node 1004 is at the VSS level, thereby disabling resistive load element transistors M7 and M8. Additionally, the external power supply coupled to VDD input node 1002 is active and coupled to node 1002. In mode 4, normal operation mode two, the non-volatile memory system is utilized in a data processing system where the externally provided power supply VDD is presumed always active. By tying the VBAT input node 1004 to ground, transistors M7 and M8 are disabled, reducing the power consumption of the integrated circuit while allowing the non-volatile memory system to function as it would in mode 1, normal operation. In mode 5, standby mode second, no clock inputs are present, the clock signals coupling to input node 1000 being at an inactive non-cycling mode. Transistor M1 is disabled after a short delay by the clock detect circuitry, thereby eliminating the coupling via M1 of the internal VDD node 1010 to the VDD input node 1002. Since the VBAT input node 1004 is coupled to ground, diode D2 will remain reverse biased in this mode. As the voltage at node 1010 drops one diode voltage drop below the voltage level at the VDD input node 1002, diode D1 becomes forward biased, thereby coupling the voltage present in input node 1002 to the internal VDD node 1010. Since node 5 is utilized only in a system where the main VDD supply coupled to node 1002 is presumed always present, no auxiliary battery power supply is required. Under these conditions, mode 5 parallels standby mode, mode 2, and power down mode, mode 3, combined for use as an on-board in system non-volatile memory. When the clock signal coupled to input node 1000 switches inactive and stops cycling, transistor M1 is turned off, and power is supplied to the internal VDD node 1010 via diode D1, just as in mode 2 standby mode, except that transistors M7 and M8 are turned off, thereby reducing power is consumption in mode 5 as compared to mode 2.

Referring to FIG. 43, a cross section of the circuit of FIG. 42 is shown. In the preferred embodiment as shown in FIG. 43, the power switching circuit is designed in metal gate CMOS technologies, although other MOS and bipolar technologies may be utilized with the present invention. In the preferred embodiment, N-channel devices (diodes D3, transistors M3, M5, M6, and M8) are built in a P tank 1030, and has P-channel devices (diodes D1 and D2, and transistors M1, M2 and M4) are built in an N substrate 1040. The N substrate 1040 forms the internal VDD power supply node 1010 for the power switching circuit.

While the present invention has been disclosed with respect to particular embodiments, it is understood by those skilled in the art that the present invention may be utilized in other embodiments, systems, circuits, and technologies, within the spirit of the present invention as set forth in the appended claims.

What is claimed is:

1. A power controller system comprising:
   a main unit including (a) a first DC power source and (b) a plug-in port having a plurality of contacts, at least one of said contacts connected to said first DC power source; and
   a plug-in module unit including (a) a plug-in connector having a plurality of contacts adapted for connection to said plug-in port, at least one of said contacts being a power supply contact corresponding to said at least one contact of said plug-in port connected to said first DC power source, (b) a second DC power source, (c) a power utilization device requiring continuous DC power for proper operation, (d) a first power switching means for connecting said power supply contact to said power utilization device when the voltage on said power supply contact exceeds a predetermined value for a predetermined period of time, (e) a second power switching means for connecting said second DC power source to said power utilization device when the voltage on said power supply contact falls below said predetermined value, and (f) a module housing having said plug-in connector, said second power source, said power utilization device, and said first and second power switching means disposed therein.

2. A power controller system as claimed in claim 1, wherein:
   said plug-in module unit further includes a power source isolation means disposed in said module housing for isolating said second DC power source from said power supply contact when the voltage on said power supply contact is less than said predetermined value.

3. A power controller system as claimed in claim 2, wherein:
   said plug-in module unit further includes a resistive means disposed in said module housing and connected to said power supply contact for discharging any charge stored on said power supply contact when no voltage is applied to said power supply contact.

4. A power controller system as claimed in claim 1, wherein:
   said plug-in module unit further includes a second power utilization device disposed in said module housing and connected to said power supply contact, said second power utilization device not requiring continuous DC power for proper operation.

5. A power controller system as claimed in claim 1, wherein:
   said main unit further includes a clock signal generating means connected to at least one of the contacts of said plug-in port; and
   said plug-in connector further includes a clock signal contact corresponding to said at least one contact of said plug-in port coupled to said clock signal generating means;
   said power utilization means includes at least a portion thereof connected to said clock signal contact and adapted to utilize clock signals appearing thereon; and
   said first power switching means includes clock signal sensing means connected to said clock signal contact for sensing when a predetermined number of clock signals have appeared on said clock signal contact while the voltage on said power supply contact exceeds said first predetermined value, thereby setting said predetermined period of time.

6. A power controller system as claimed in claim 5, wherein;
   said plug-in module unit further includes a resistive means disposed in said module housing and connected to said clock signal contact for discharging any charge stored on said clock signal contact when no clock signal appears on said clock signal contact.

7. A power controller system for a plug-in module unit comprising:
   a plug-in connector having a plurality of contacts adapted for connection to a plug-in port, at least one of said contacts being a power supply contact;
   a DC power source;
   a power utilization device requiring continuous DC power for proper operation;
   a first power switching means for connecting said power supply contact to said power utilization device when the DC voltage on said power supply contact exceeds a predetermined value for a predetermined period of time;
   a second power switching means for connecting said DC power source to said power utilization device when the voltage on said power supply contact falls below said predetermined value; and
   module housing having said plug-in connector, said DC power source, said power utilization device, and said first and second power switching means disposed therein.

8. A power controller system as claimed in claim 7, wherein:

said plug-in module unit further includes a power source isolation means disposed in said module housing for isolating said DC power source from said power supply contact when the voltage on said power supply contact is less than said predetermined value.

9. A power controller system as claimed in claim 8, wherein:
said plug-in module unit further includes a resistive means disposed in said module housing and connected to said power supply contact for discharging any charge stored on said power supply contact when no voltage is applied to said power supply contact.

10. A power controller system as claimed in claim 7, wherein:
said plug-in module unit further includes a second power utilization device disposed in said module housing and connected to said power supply contact, said second power utilization device not requiring continuous DC power for proper operation.

11. A power controller system as claimed in claim 7 wherein:
said plug-in connector further includes a clock signal contact for receiving a clock signal;
said power utilization device includes at least a portion thereof connected to said clock signal contact and adapted to utilize clock signals appearing thereon;
said first power switching means includes clock signal sensing means connected to said clock signal contact for sensing when a predetermined number of clock signals have appeared on said clock signal contact while said voltage on said power supply contact exceeds said first predetermined value, thereby setting said predetermined period of time.

12. A power controller system as claimed in claim 11, wherein:
said plug-in module unit further includes a resistive means disposed in said module housing and connected to said clock signal contact for discharging any charge stored on said clock signal contact when no clock signal appears on to said clock signal contact.

* * * * *